(12) United States Patent
Lee et al.

(10) Patent No.: US 7,183,226 B2
(45) Date of Patent: Feb. 27, 2007

(54) METHOD OF FORMING A TRENCH FOR USE IN MANUFACTURING A SEMICONDUCTOR DEVICE

(75) Inventors: Sung-Bae Lee, Hwasung (KR); Sang-Rok Hah, Seoul (KR); Hong-Seong Son, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 54 days.

(21) Appl. No.: 10/673,873

(22) Filed: Sep. 30, 2003

(65) Prior Publication Data

US 2004/0171211 A1    Sep. 2, 2004

(30) Foreign Application Priority Data

Feb. 28, 2003   (KR)   ............... 10-2003-0012763

(51) Int. Cl.
   *H01L 21/302*   (2006.01)
   *H01L 21/461*   (2006.01)
(52) U.S. Cl. .............. 438/749; 438/638; 438/675; 438/756; 438/757; 257/E21.229
(58) Field of Classification Search ............... 438/633, 438/638, 675, 747, 749, 756, 757, FOR. 112, 438/FOR. 114, 745; 257/E21.229
   See application file for complete search history.

(56) References Cited

U.S. PATENT DOCUMENTS

| | | | |
|---|---|---|---|
| 4,686,373 A * | 8/1987 | Tew et al. ................. 348/164 |
| 6,180,506 B1 * | 1/2001 | Sullivan .................... 438/618 |
| 6,245,669 B1 * | 6/2001 | Fu et al. .................... 438/636 |
| 6,420,261 B2 * | 7/2002 | Kudo ........................ 438/633 |
| 6,440,842 B1 * | 8/2002 | Chang ....................... 438/633 |
| 6,503,829 B2 * | 1/2003 | Kim et al. ................. 438/637 |
| 6,534,397 B1 * | 3/2003 | Okada et al. .............. 438/633 |
| 6,576,947 B1 * | 6/2003 | Kim .......................... 257/309 |
| 6,635,566 B1 * | 10/2003 | Blosse et al. ............. 438/638 |
| 2002/0022361 A1 * | 2/2002 | Kim et al. ................. 438/638 |
| 2002/0055271 A1 * | 5/2002 | Lee et al. .................. 438/782 |
| 2002/0167013 A1 * | 11/2002 | Iwasaki et al. ............. 257/79 |
| 2005/0026382 A1 * | 2/2005 | Akatsu et al. ............. 438/386 |

FOREIGN PATENT DOCUMENTS

| | | |
|---|---|---|
| JP | 60235428 | 11/1985 |
| KR | 2003-0002803 | 1/2003 |
| KR | 2003-0010507 | 2/2003 |

* cited by examiner

*Primary Examiner*—Michelle Estrada
(74) *Attorney, Agent, or Firm*—Volentine & Whitt, P.L.L.C.

(57) ABSTRACT

A method for use in manufacturing a semiconductor device includes forming a photoresist pattern on a substrate, performing first etching process in which an initial trench is formed using the photoresist pattern as a mask, and performing second distinct etching process to enlarge the initial trench. Thus, the initial trench can be formed using the photoresist pattern having a stable structure. Thereafter, the trench is enlarged using an etching solution having a composition based on the material in which the initial trench is formed, e.g., a silicon substrate or an insulation film. Therefore, a metal wiring, an isolation film or a contact can be formed in the enlarged trench to desired dimensions.

20 Claims, 11 Drawing Sheets

METHOD OF FORMING A TRENCH FOR USE IN MANUFACTURING A SEMICONDUCTOR DEVICE

BACKGROUND OF THE INVENTION

1. Field of the Invention

The present invention relates to a method of forming a trench and to a method of forming a semiconductor device having a trench.

2. Description of the Related Art

For some time now, semiconductor devices have been employed in most electronic devices including information processing apparatuses and home appliances. Currents demands for information processing apparatus, such as computers, require that the apparatus posses a large processing capacity and a high processing speed. Thus, semiconductor devices of the information processing apparatus must also have a high response speed and a large storage capacity. This is achieved through the integration of the semiconductor device.

In general, the capacity of random access memory (RAM) chips has been improving according to Moores' law. Moores' law, postulated from empirical data, indicates that the storage capacity of memory chips has increased by a factor of four every three years. This increase has been accomplished through a combination of reducing the size of semiconductor devices installed on the chip, and increasing the length of the chip accordingly. The smaller the semiconductor device installed on the silicon chip becomes, the finer the interconnect lines of the semiconductor device must become. However, the signals running through the interconnect lines may interfere with each other when the interconnect lines are arranged close to one another. In fact, delays in the device will be caused by the interference when the spacing of the interconnect lines is below a predetermined value. The specific resistance of the metal used for forming the interconnect lines must be reduced in this situation if a high processing speed of the semiconductor devices is to be maintained.

Until recently, the interconnect lines of the semiconductor device were formed using aluminum (Al) or an aluminum alloy having a specific resistance of approximately 2.66 $\mu\Omega\cdot cm$. However, in 1998, International Business Machine Co. disclosed a method for forming an interconnect line with copper (Cu). Moreover, since then, various researchers have improved upon the method of forming interconnect lines or wiring using copper. In particular, a damascene process was developed in order to form copper interconnection lines or copper wiring. More specifically, a dual damascene process is often advantageously employed to form metal wiring and a contact all at once.

Recently, the damascene process for forming metal wiring of a semiconductor device or a bottom electrode of a capacitor has been preceded by etching an insulation layer to form a trench having a predetermined dimension in the insulation layer, wherein the damascene process entails forming a copper film in the trench using electroplating and chemical mechanical polishing (CMP) techniques. U.S. Pat. No. 6,259,128 (issued to Douglas R. Robert et. al.), Korean Patent Laid-Open Publication No. 2003-10507, and Korean Patent Laid-Open Publication No. 2003-2803 all disclose such methods of forming an insulation layer, a trench, a metal wiring and a capacitor.

FIGS. 1A and 1B illustrates a conventional method of forming a trench. Referring to FIG. 1A, an insulation layer 15 comprising an oxide or nitride is formed on a semiconductor substrate 10 such as a silicon wafer. A photoresist film (not shown) is then formed on the insulation layer 15. The photoresist film is exposed and developed to form a photoresist pattern 20 on the insulation layer 15. The photoresist pattern 20 is used as an etching mask during an etching process for forming the trench. Accordingly, the photoresist pattern 20 should have a height h and a width w sufficient for forming a trench having a desired width and depth. If the height of the photoresist pattern 20 is too small, the photoresist 20 may be completely consumed before the trench is not completely formed in the insulation film 15 during the etching process. In addition, the photoresist pattern 20 should have a relatively small width w because the trench becomes too narrow when the photoresist pattern 20 is too wide.

Generally, the photo resist pattern 20 on the insulation layer 15 should have an aspect ratio (a ratio of the height h relative to the width w) of more than about 3, as shown in FIG. 1A, for a satisfactory trench to be formed by etching the insulation layer 15 using the photoresist pattern 20 as an etching mask. However, as shown in FIG. 1B, the photoresist pattern 20 has an unstable structure when the photoresist pattern 20 has an aspect ratio of about 3– so much so that the photoresist pattern 20 may collapse on the insulation film 15. If an attempt to solve this problem is made by augmenting the width of the photoresist pattern 20, the width of the trench becomes too narrow (in an inversely proportional relation). Hence, copper (Cu) wiring may not be formed in the trench to a desired dimension by the damascene process because of limitations that the photoresist pattern 20 imposes on the dimensioning of the trench. Additionally, the trench may not be formed in the insulation layer 15 at all or the trench may not have accurate dimensions when the etching process for forming the trench is performed using a mask as a photoresist pattern 20 that has collapsed on the insulation layer 15. In this case, a defective semiconductor device may be produced, i.e., the yield of the semiconductor device manufacturing process is reduced. Furthermore, striations may be formed on the insulation layer 15 or on the metal wiring when a successive manufacturing process is performed while the photoresist pattern 20 is collapsed. In this case, a fatal manufacturing error may occur during the next manufacturing process.

SUMMARY OF THE INVENTION

One feature of the present invention is to provide a reliable method capable of yielding trenches having precise dimensions for use in the manufacturing of semiconductor devices.

Another feature of the present invention is to provide a method of forming a conductive pattern having a desired dimension in the manufacturing of semiconductor devices.

Still another feature of the present invention is to provide a method of manufacturing a semiconductor device including metal wiring or a conductive pattern having very precise dimensions.

According to one aspect of the present invention, an insulation film is formed on a substrate, a photoresist pattern is formed on the insulation film, and two distinct etching processes are then carried out. The first etching process is performed to form an initial trench in the insulation film using the photoresist pattern as a mask. The second etching process is subsequently executed to enlarge the initial trench. The insulation film may comprise an oxide, a fluoride or a nitride film. The second etching process is performed using an etching solution including hydrogen fluoride, ammonium fluoride, hydrogen peroxide and deionized water when the insulation film is an oxide or a fluoride film. Otherwise, the second etching process is performed using an etching solution including hydrogen fluoride, phosphoric acid and deionized water when the insulation film is a nitride film. The etching solution may further include an antioxidant such as benzo triazole to prevent a metal film subsequently formed in the enlarged trench from oxidizing.

According to another aspect of the present invention, conductive material is deposited in the enlarged trench to thereby form a conductive pattern having dimensions corresponding to those of the enlarged trench.

According to still another aspect of the present invention, a photoresist pattern is formed on a substrate, and the substrate is then subjected to two distinct etching processes. In a first etching process, an initial trench is formed in the substrate using the photoresist pattern as a mask. The initial trench is then enlarged by a second etching process. Finally, an oxide film is formed to fill the enlarged trench. The second etching process may be either a wet bench process in which the substrate is immersed in an etching solution, or a single spin station or a cylindrical spin station process in which an etching solution is sprayed on one or more substrates while the substrates are rotated.

According to yet another aspect of the present invention, two distinct etching processes are used to form a dual damascene structure of a semiconductor device. First, a first insulation film is formed on a substrate and a first conductive pattern is formed in the insulation film. At least one etch stop layer and at least one second insulation film are then subsequently formed on the first insulation film. Next, a first photoresist pattern is formed on the second insulation film. Subsequently, the etch stop layer and the second insulation film are etched using the first photoresist pattern as a mask to thereby forming a via hole that exposes the first conductive pattern. The first photoresist pattern is then removed. A second photoresist pattern is formed on the second insulation film after the first photoresist pattern has been removed, and an initial trench is formed in alignment with the via hole by etching the etch stop layer and the second insulation film using the second photoresist pattern as a mask. The initial trench is then enlarged by etching the second insulation film. Finally, conductive material is deposited over the structure to form a second conductive pattern in the via hole and a third conductive pattern in the enlarged trench, respectively.

According to the present invention, the initial trench can be formed using a first etching process in which a photoresist pattern having a stable structure is used as an etching mask. Then, the initial trench is enlarged by performing the second etching process. The second etching process is performed using an etching solution having a composition developed in accordance with the composition of the layer of material in which the initial trench is formed. Therefore, the final trench has precise dimensions. Accordingly, the patterned structure that is formed by filling the trench, e.g. a metal wiring, an oxide layer, or a conductive pattern, will also have precise dimensions.

BRIEF DESCRIPTION OF THE DRAWINGS

The above and other aspects and features of the present invention will become more apparent from the following detailed description of the preferred embodiments thereof made with reference to the accompanying drawings, in which.

DETAILED DESCRIPTION OF THE PREFERRED EMBODIMENTS

Figure 1A:
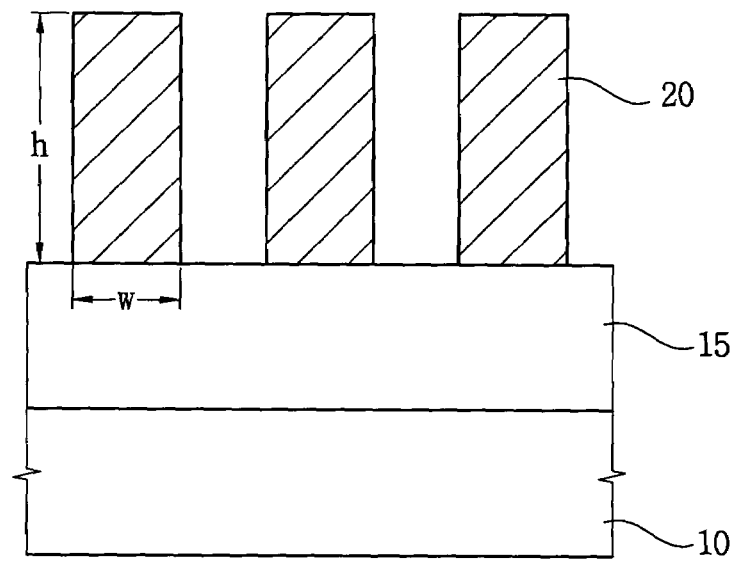
FIGS. 1A and 1B are cross-sectional views of a semiconductor substrate illustrating a conventional method of forming a trench.
Figure 1B:
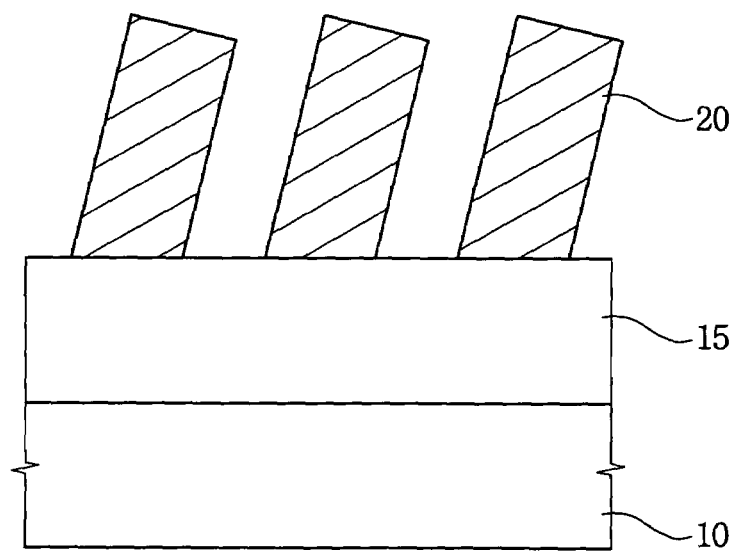

The preferred embodiments of the present invention will be described in detail hereinafter with reference to the accompanying drawings. Like reference numerals designate similar or identical elements throughout the drawings.

Figure 2A:
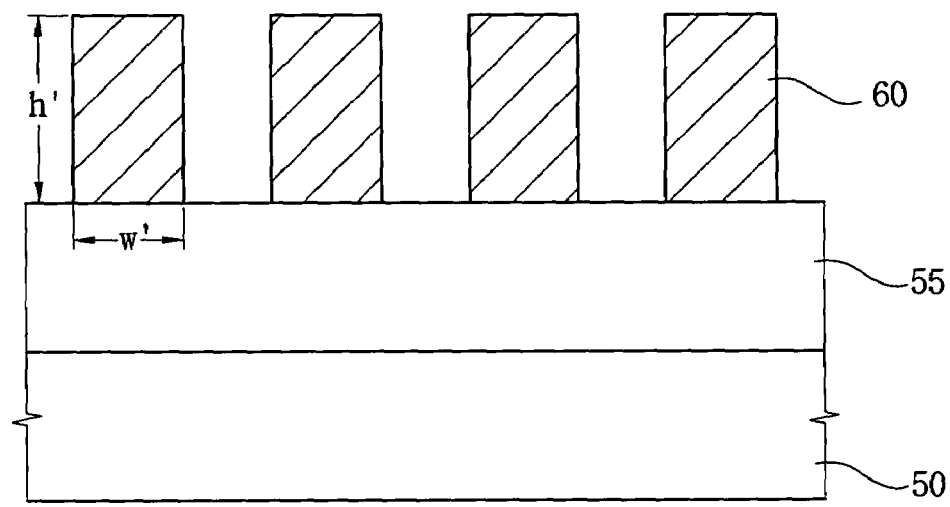
FIGS. 2A to 2C are cross-sectional views of a semiconductor substrate illustrating one embodiment of a method of forming a trench according to the present invention.

Referring to FIG. 2A, an insulation layer 55 is formed on a semiconductor substrate 50, having transistor structures thereon (not shown), using a thermal oxidation process or a chemical vapor deposition (CVD) process. The insulation layer 55 comprises an oxide, a nitride or a fluoride. In particular, the insulation layer 55 may include an oxide such as a middle temperature oxide (MTO), tetraethyl orthosilicate (TEOS), boro-phosphor silicate glass (BPSG) or undoped silicate glass (USG). In addition, the insulation layer 55 may comprises fluorinated silicate glass (FSG) or silicon oxyfluoride (SiOF). Furthermore, the insulation layer 55 may include a nitride such as silicon nitride ($Si_xN_y$) or silicon oxynitride (SiON). In any case, the insulation layer 55 covers the transistor structures on the semiconductor substrate 50.

After a photoresist film (not shown) is formed on the insulation layer 55, the photoresist film is developed and exposed to form a photoresist pattern 60. In this case, the photoresist pattern 60 has an aspect ratio far less than that of the prior art. That is, the photoresist pattern 60 has a width w' greater than that of the photoresist pattern shown in FIG. 1A while the photoresist pattern 60 has a height h' that is less than that of the conventional photoresist pattern shown in FIG. 1A. The photoresist pattern 60 of the present invention has a stable structure because the photoresist pattern 60 has a small aspect ratio. As a result, the photoresist pattern 60 does not collapse on the insulation layer 55.

Figure 2B:
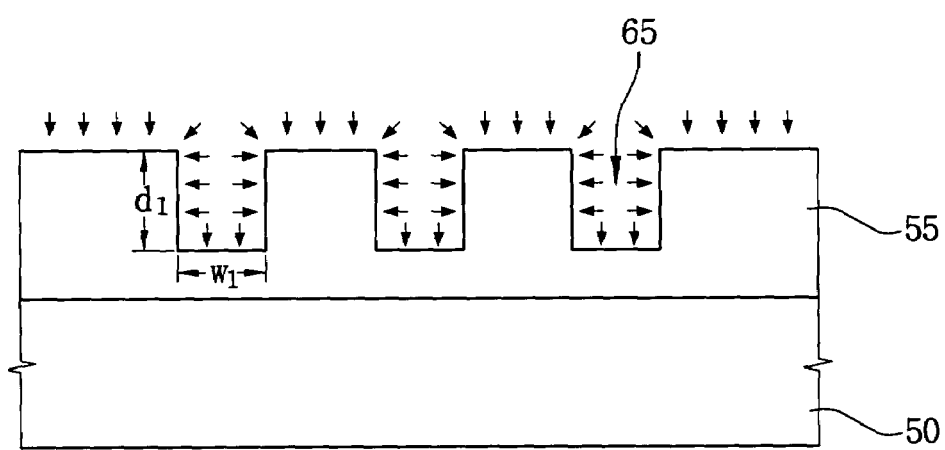

Referring to FIG. 2B, the insulation layer 55 is etched using a first etching solution and the photoresist pattern 60 as a mask to form a trench 65 (an initial trench) in the insulation layer 55. The first width $w_1$ and the first depth $d_1$ of the trench 65 depend on the dimension of the metal wiring to be formed in the trench 65. For example, the trench 65 has a first width $w_1$ of approximately 1,000 to 1,200 Å when the line width of the metal wiring is to be about 1,500 to about 2,400 Å. In addition, the trench 65 has the first depth $d_1$ based on the thickness of the insulation film 55.

Then, a second etching process is performed using a second etching solution, as shown by arrows in FIG. 2B. The second etching process may be a wet bench process, a single spin station process or a chemical spin station process. The wet bench process comprises immersing the semiconductor substrate 50 into a bath containing the second etching solution. About 25 to about 50 substrates can be simultaneously etched in the bath. On the other hand, the single spin station process comprises mounting the semiconductor substrate 50 on a rotatable chuck, and spraying the second etching solution onto the insulation layer 55 while the substrate 50 is being rotated by the chuck. Still further, the chemical spin station process may comprise inserting about 25 to about 50 substrates into a cylindrical station, and then spraying the second etching solution onto the insulation layer 55 while the substrates are rotated in the cylindrical station.

In the present embodiment, when the insulation film 55 includes an oxide or a fluoride, the second etching solution includes fluorine. Preferably, the second etching solution includes hydrogen fluoride (HF), ammonium fluoride ($NH_4F$), hydrogen peroxide ($H_2O_2$) and deionized water ($H_2O$). In this case, the volumetric ratio between the hydrogen fluoride and the ammonium fluoride is approximately 1:1 to 1:10, and the volumetric ratio between the hydrogen fluoride and the hydrogen peroxide is approximately 1:1 to 1:10. In addition, the volumetric ratio between the hydrogen fluoride and the deionized water is approximately 1:100 to 1:500. The second etching solution having the composition described above can etch the insulation film 55 at a rate of close to 40 to 60 Å/minute.

On the other hand, the second etching solution includes phosphoric acid ($H_3PO_4$) and deionized water when the insulation film 55 comprises a nitride. When the metal wiring to be formed in the trench 65 is of copper (Cu), the second etching solution includes an antioxidant, such as benzo triazole (BTA), to prevent the metal wiring from oxidizing.

Figure 2C:
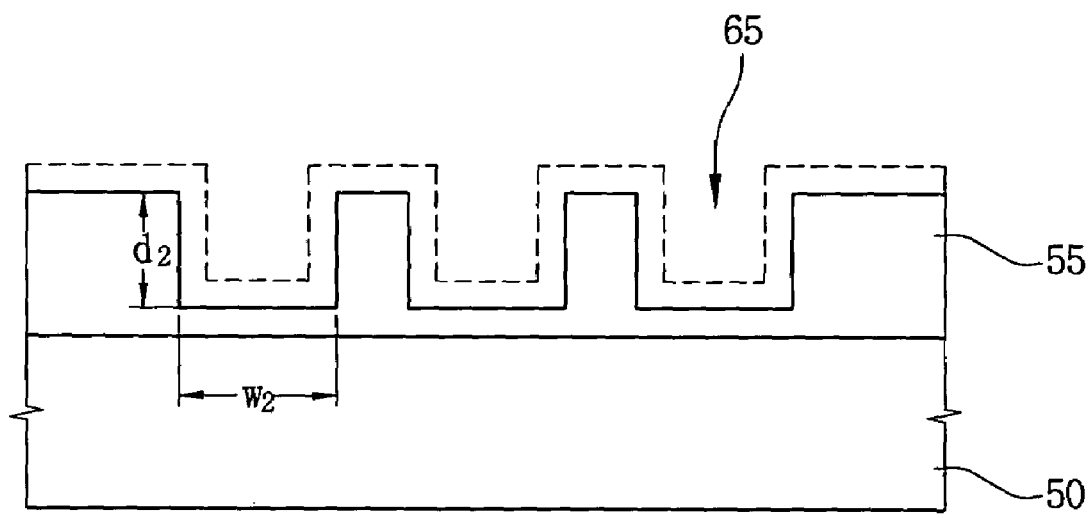

Referring to FIG. 2C, the second etching process enlarges the trench 65. That is, the trench 65 has a second width $w_2$ wider than the first width $w_1$ and a second depth $d_2$ substantially identical to the first depth $d_1$. For example, when the trench 65 has the first width $w_1$ of about 1,000 to about 1,200 Å, the second etching process is performed for about 6 to about 10 minutes. At the end of the second etching process, the trench 65 has the second width $w_2$ of about 1,500 to about 2,400 Å because the etching rate of the insulation layer 55 is about 40 to about 60 Å/minute. The second depth $d_2$ of the trench 65 is substantially identical to the first depth $d_1$ because the upper portion of the insulation layer 55 is etched along with a lower portion of the insulation layer 55 that defines the bottom of the trench 65.

Therefore, a metal wiring having a desired line width can be formed in the trench 65 using a damascene process because the trench 65 is provided with precise dimensions through the first and second etching processes.

FIGS. 3A to 3D illustrates another embodiment of a method of forming a trench according to the present invention.

Figure 3A:
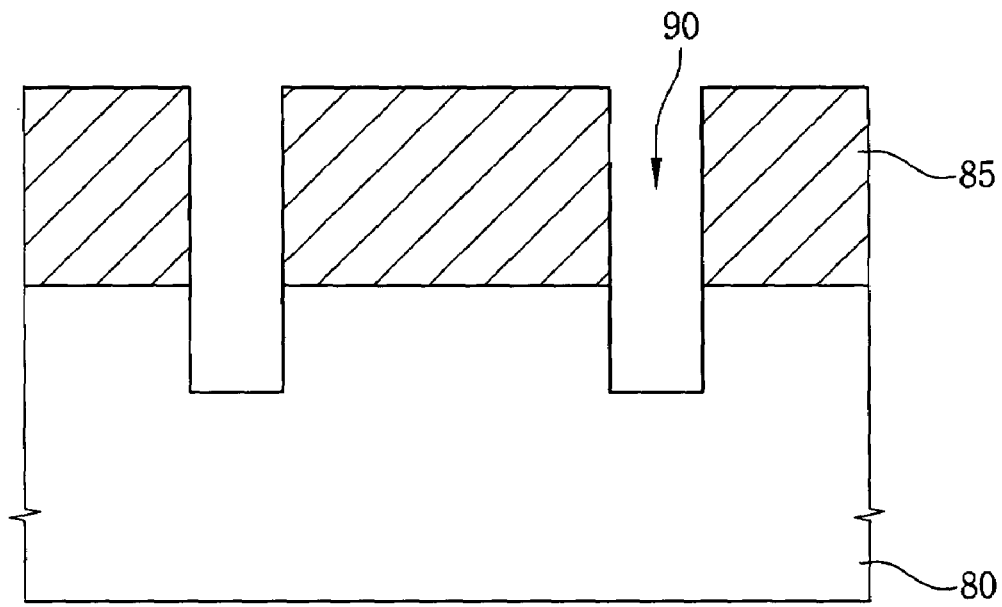
FIGS. 3A to 3D are cross-sectional views of a semiconductor substrate illustrating another embodiment a method of forming a trench according to the present invention.
Figure 3B:
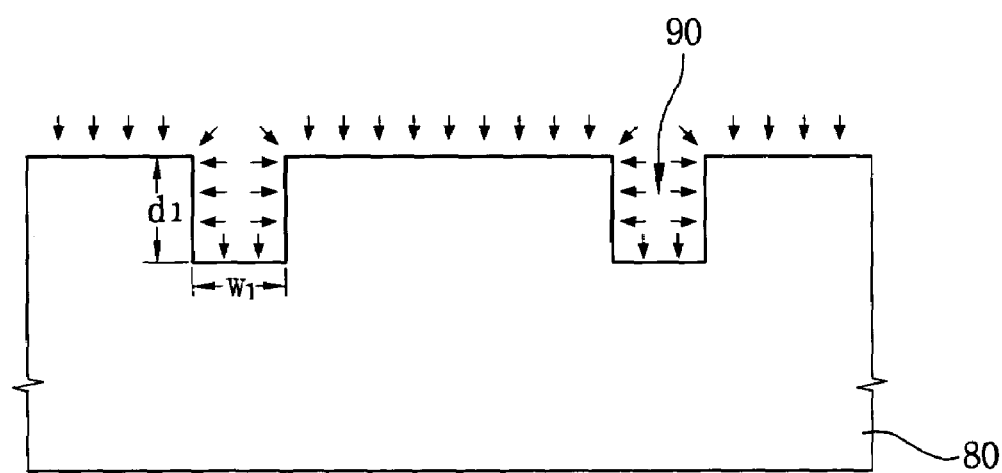

Referring to FIG. 3A, a trench 90 is formed in a semiconductor substrate 80, comprising silicon, to define a cell region and a peripheral circuit region. More specifically, a photoresist film (not shown) is formed on the substrate 80. The photoresist film is then exposed and developed to form a photoresist pattern 85. The substrate 80 is etched (a first etching process) using the photoresist pattern 85 as a mask, thereby forming the trench 90 in the substrate 80. Referring to FIG. 3B, the trench 90 has a first width $w_1$ and a first depth $d_1$ once the first etching process is completed. The first width $w_1$ of the trench 90 is narrower than an isolation film to be formed later in the trench 90.

The trench 90 is enlarged using a second etching process. As described above, the second etching process may be a wet bench process, a single spin station process or a chemical spin station process.

In this embodiment, the second etching process is performed using an etching solution including hydrogen fluoride, nitric acid ($HNO_3$) and deionized water in order to etch the semiconductor substrate 80 in which the trench 90 has been formed. The substrate 80 is etched at an etching rate of about 40 to about 60 Å/minute. The duration of the second etching process can be selected so that the isolation film to be formed in the trench 90 will have the desired dimensions.

Figure 3C:
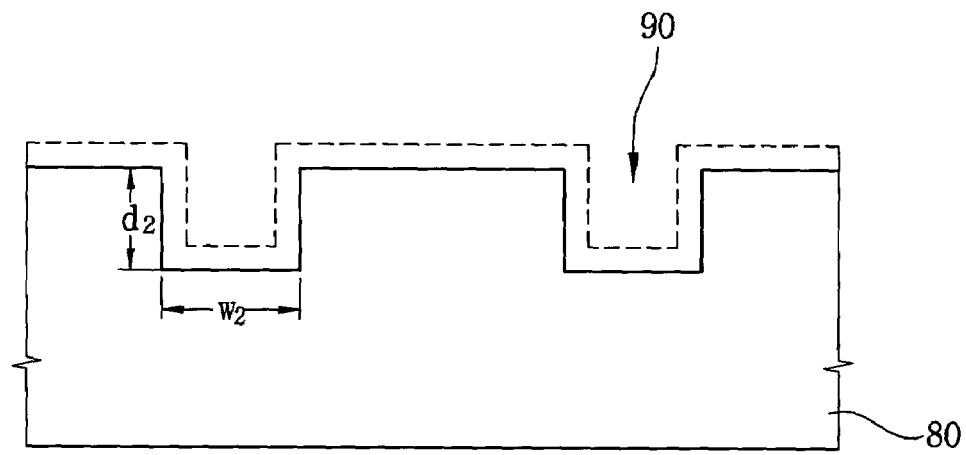

Referring to FIG. 3C, after the second etching process has performed, the trench 90 has a second width $w_2$ greater than the first width $w_1$ and a second depth $d_2$ substantially identical to the first depth $d_1$. For example, when the trench 90 has a first width $w_1$ of about 1,000 to about 2,000 Å, the second etching process can be performed for about 5 to 10 minutes to form the trench 90 having the second width $w_2$ of approximately 2,200 to 3,200 Å (based on the etching rate of the second etching process of about 40 to about 60 Å/minute). Again, the second depth $d_2$ of the trench 90 is substantially identical to the first depth $d_1$ because the upper portion of the substrate 80 is etched along with a lower portion defining the bottom of the trench 90 during the second etching process.

Figure 3D:
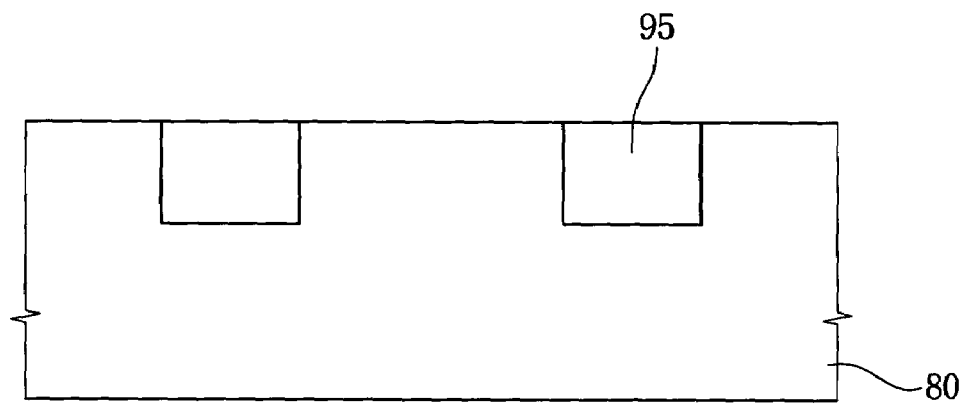

Referring to FIG. 3D, an initial oxide film (not shown) is formed on the substrate 80 using a chemical vapor deposition (CVD) process to fill the trench 90. The initial oxide film is etched using an etch-back process or a chemical mechanical polishing (CMP) process so as to form an isolation film 95 in the trench 90. The isolation film 95 demarcates the active region and the peripheral circuit region on the semiconductor substrate 80.

Figure 4A:
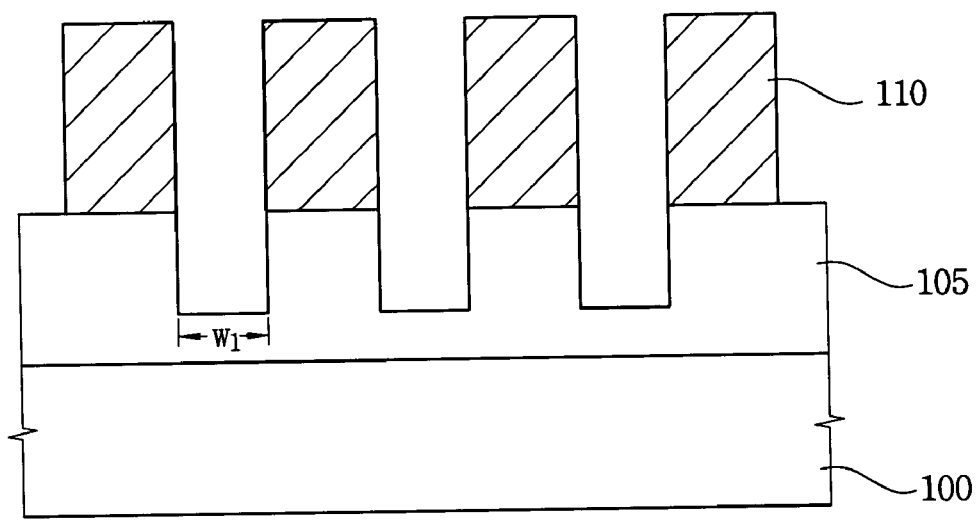
FIGS. 4A to 4C are cross-sectional views of a semiconductor substrate illustrating one embodiment of a method of forming a conductive pattern according to the present invention.
Figure 4B:
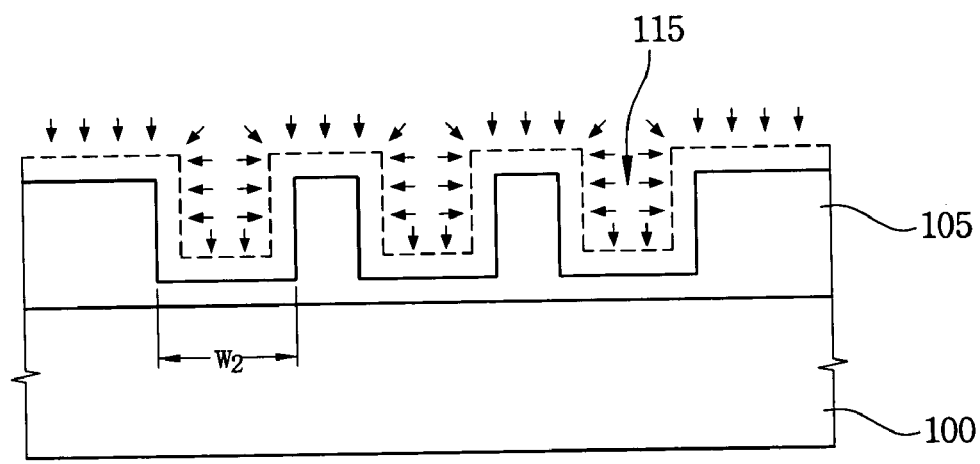
Figure 4C:
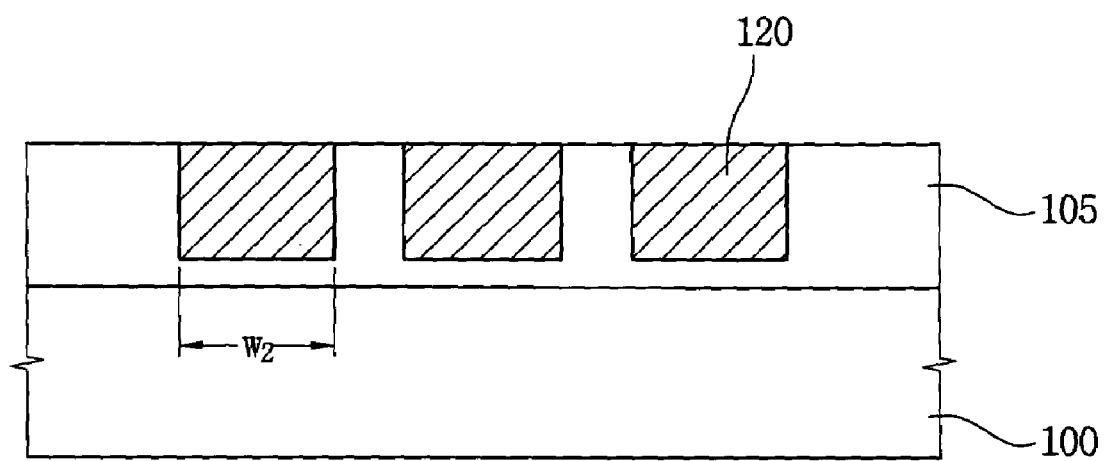

FIGS. 4A to 4C illustrate a method of forming a conductive pattern according to the present invention. Referring to FIG. 4A, an isolation film 105 is formed on a semiconductor substrate 100 having transistor structures (not shown) formed thereon using a CVD process. The insulation film 105 includes an oxide, a nitride or a fluoride. In this case, the insulation film 105 includes an oxide such as MTO, TEOS, BPSG or USG. Additionally, the insulation film 105 includes a fluoride such as FSG or silicon oxyfluoride or the insulation film 105 includes a nitride such as silicon nitride or silicon oxynitride. The insulation film 105 covers the transistor structures formed on the semiconductor substrate 100. Alternatively, an upper portion of the insulation film 105 can be planarized using a CMP process or an etch-back process.

After a photoresist film (not shown) is formed on the insulation film 105 using a spin coating process, the photoresist film is patterned to form a photoresist pattern 110 using an exposure process and a developing process.

The insulation film 105 is etched partially using the photoresist pattern 110 as a mask to form a trench 115 having a first width $w_1$ on the insulation film 105. That is, the trench 115 first having the first width $w_1$ is formed using a first etching solution by a first etching process. When a metal wiring or a conductive pattern formed in the trench 115 has a width of about 1,500 to about 2,400 Å, the first width $w_1$ of the trench 115 is about 1,000 to about 2,000 Å. The metal wiring includes a bit line and the conductive pattern includes a bottom electrode of a capacitor, a contact or a pad of a semiconductor device. The conductive pattern or the metal wiring includes copper (Cu), aluminum (Al) or tungsten (W).

In the present embodiment, because the trench 115 has an extended with using a successive process for extending the width of the trench 115, the photoresist pattern 110 formed on the insulation film 105 has an aspect ratio greatly smaller than that of the conventional photoresist pattern as described above. Thus, the photoresist pattern 110 has a stable structure to prevent the photoresist pattern 110 from falling down on the insulation film 105.

Referring to FIG. 4B, the resultant structure including the insulation film 105 having the trench 115 therein is etched using a second etching solution. This second etching process may be a wet bench process, a single spin station process or a chemical spin station process. The second etching solution has a composition based on the composition of the insulation film 105. For instance, the second etching solution includes hydrogen fluoride, ammonium fluoride, hydrogen peroxide and deionized water when the insulation film 105 includes oxide or fluoride. Also, the second etching solution includes hydrogen fluoride, phosphoric acid and deionized water when the insulation film 105 includes a nitride.

Alternatively, when the conductive pattern including copper is formed in the trench 115, the second etching solution includes an antioxidant such as BTA in order to prevent the conductive pattern from oxidizing. The antioxidant forms an insoluble film on the surface of the trench 115 to protect the conductive pattern.

In any case, the width of the trench 115 is increased so that the trench 115 has a second width $w_2$. More specifically, the second etching solution etches the insulation film 105 at a rate of about 40 to about 60 Å/minute. Therefore, when the first width $w_1$ of the trench 115 is about 1,000 to about 1,200 Å, and the second etching process is performed about 6 to about 10 minutes, the second width $w_2$ of the trench 115 becomes about 1,500 to about 2,400 Å. Hence, the trench 115 has dimensions that will facilitate the forming of a conductive pattern having desired dimensions in the trench 115.

Referring to FIG. 4C, a conductive film (not shown) is formed on the insulation film 105 to fill the trench 115 having the second width $w_2$. The conductive film is formed using a sputtering process, a CVD process or an electroplating process. The conductive film includes copper, tungsten, aluminum, titanium or titanium nitride.

A portion of the conductive film on the insulation film 105 is removed using an etch-back process or a CMP process so that a conductive pattern 120 is formed in the trench 115. The conductive pattern 120 may serve as a metal wiring, an electrode, a contact or a pad of a semiconductor device.

FIGS. 5A to 5E illustrate a method of forming a semiconductor device according to the present invention. In this embodiment, the manufacturing of the semiconductor device employs a dual damascene process.

In general, a dual damascene structure of a semiconductor device includes a via hole structure and a trench structure. A contact for an electrical connection between an upper conductive film and a lower conductive film is formed in the via hole, and a metal wiring is formed in the trench. To form the dual damascene structure, the trench can be formed in an insulation film at the via hole. Additionally, the via hole can be formed after the trench is formed in the insulation film. Furthermore, the via hole and the trench can be simultaneously formed through and in the insulation film. In the present embodiment, a trench is formed at a via hole extending through an insulation film.

Figure 5A:
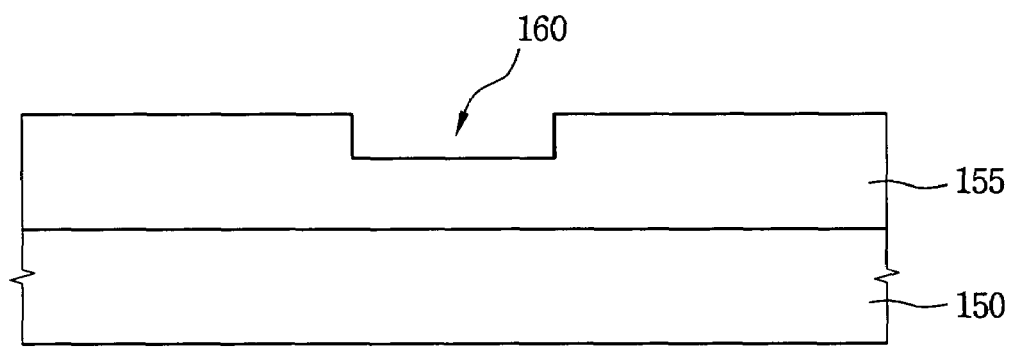
FIGS. 5A to 5E are cross-sectional views of a semiconductor substrate illustrating one embodiment of a method of forming a semiconductor device according to the present invention.

Referring to FIG. 5A, an isolation film (not shown) is formed on a semiconductor substrate 150 in order to define a cell area and a peripheral circuit area on the substrate 150. A transistor structure (not shown) is formed on the cell area of the substrate 150. In this case, an isolation region can be manufactured according to the method described with reference to FIGS. 3A to 3D. That is, a first trench (not shown) is formed in the substrate 150, and then the width of the first trench is enlarged using an etching process. Then, the first trench is filled with an oxide film to form an isolation film for isolating the circuit area from the peripheral area. Alternatively, the isolation film can be formed using a thermal oxidation process such as a local oxidation of silicon (LOCOS) process or a shallow trench isolation (STI) process.

A first insulation film 155 including oxide, fluoride or nitride is then formed on the semiconductor substrate 150. Subsequently, a part of the first insulation film 155 is etched using a photolithography process to form a second trench 160 in the first insulation film 155.

The second trench 160 is enlarged by using an etching solution that has a composition that is based on the composition of the first insulation film 155 (i.e., by using a second etching process as described above). As a result, the width of the second trench 160 is increased.

Figure 5B:
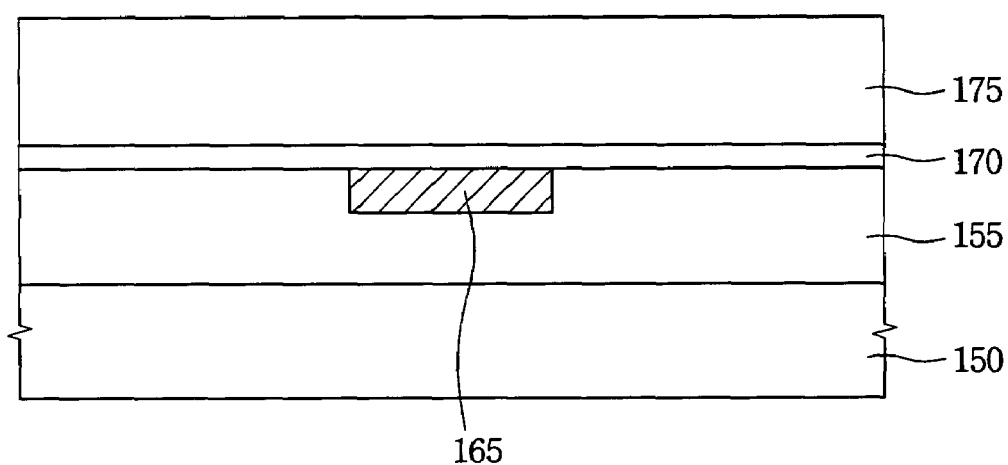

Referring to FIG. 5B, a first conductive film (not shown) is formed on the first insulation film 105 using a sputtering process, a CVD process or an electroplating process to thereby fill the second trench 160. The first conductive film is etched using an etch-back process or a CMP process to form a first conductive pattern 165 in the second trench 160. At this time, an upper surface of the first conductive film 165 is exposed.

A first etch stop layer 170 is formed on the first insulation film 155 including over the first conductive pattern 165. The first etch stop layer 170 includes a non-oxide material such as a nitride or a carbon-based compound such as silicon carbide (SiC). The first etch stop layer 170 protects the first conductive pattern 165 during subsequent processes used to form a third trench and a via hole (described in more detail below).

A second insulation film 175 including an oxide, a fluoride or a nitride is formed on the first etch stop layer 170. The material of the second insulation film 175 may be identical to or different from that of the first insulation film 155. The via hole will be formed through the first etch stop layer 170 and the second insulation film 175 in order to facilitate the forming of an electrical contact connected to the first conductive pattern 165. The second insulation film 175 electrically insulates contacts formed in adjacent via holes from one another.

Figure 5C:
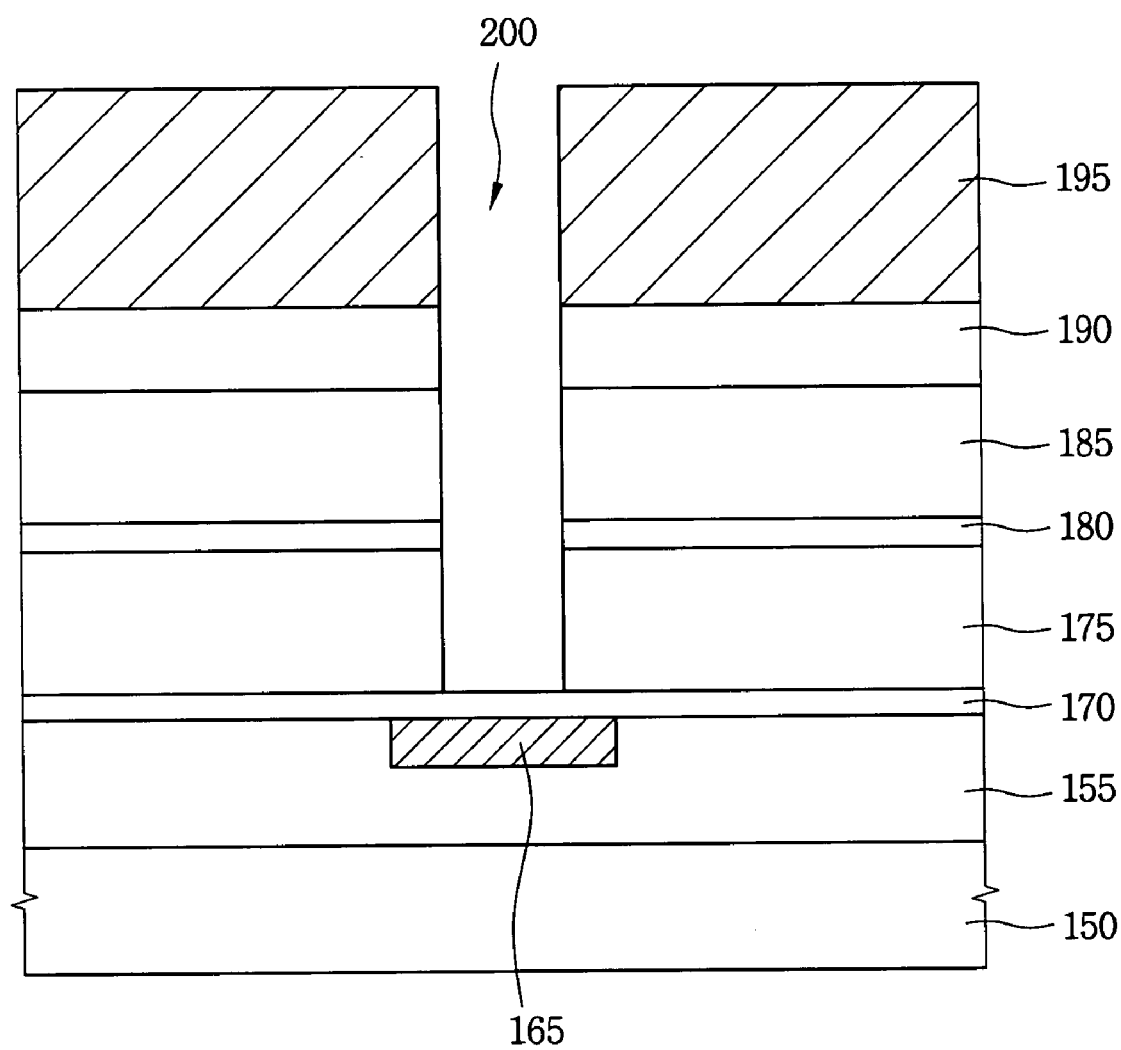

Referring to FIG. 5C, a second etch stop layer 180 and a third insulation film 185 are successively formed on the second insulation film 175. The second etch stop layer 180 includes a non-oxide material such as a nitride or a carbon-based compound like f silicon carbide, and the third insulation film 185 includes and oxide. A third trench will be formed on the third insulation film 185, and the metal wiring will be formed in the third trench. The third insulation film 185 electrically insulates adjacent portions of the metal wiring formed in the third trenches, respectively. The second etch stop layer 180 provides an end point of the process in which the third insulation film 185 is etched to form the third trench. However, the second etch stop layer 180 cannot be omitted.

A capping layer 190 including an oxide or a fluoride is formed on the third insulation film 185. For example, the capping layer 190 includes un-doped silicon oxide ($SiO_2$), silicon oxide formed using a plasma enhanced CVD process, USG, or TEOS. Alternatively, the capping layer 190 includes silicon oxyfluoride (SiOF).

A first photoresist film (not shown) is then formed on the capping layer 190. Subsequently, the first photoresist film is exposed and developed to form a first photoresist pattern 195 for use in forming the via hole 200. That is, the capping layer 190, the third insulation film 185, the second etch stop layer 180 and the second insulation film 175 are successively etched using the first photoresist pattern 195 as an etching mask so that the via hole 200 exposes a portion of the first etch stop layer 170.

Figure 5D:
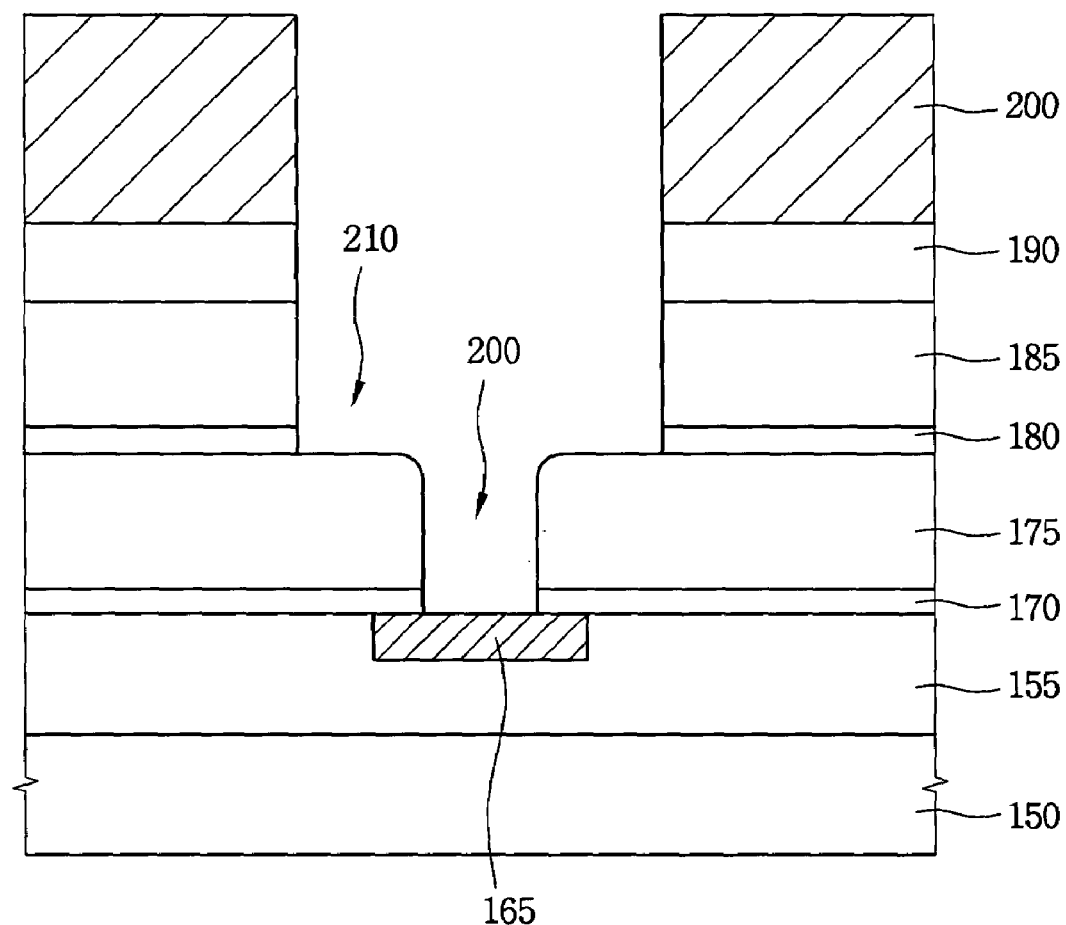

Referring to FIG. 5D, the photoresist pattern 195 is removed using an ashing process and a stripping process. Then, a second photoresist film (not shown) is formed on the capping layer 190. The second photoresist film is exposed and then developed to form a second photoresist pattern 205 that exposes the via hole 200 and a portion of the capping layer 190 around the via hole 200.

The capping layer 190, the third insulation film 185, the second etch stop layer 180 and the first etch stop layer 170 are etched using the second photoresist pattern 205 as an etching mask. Thus, a third trench 210 extending from the via hole 200 is formed in the second etch stop layer 180 to the capping layer 190. The third trench 210 is wider than the via hole 200. Note, the first conductive pattern 165 is exposed during the forming of the third trench 210.

Figure 5E:
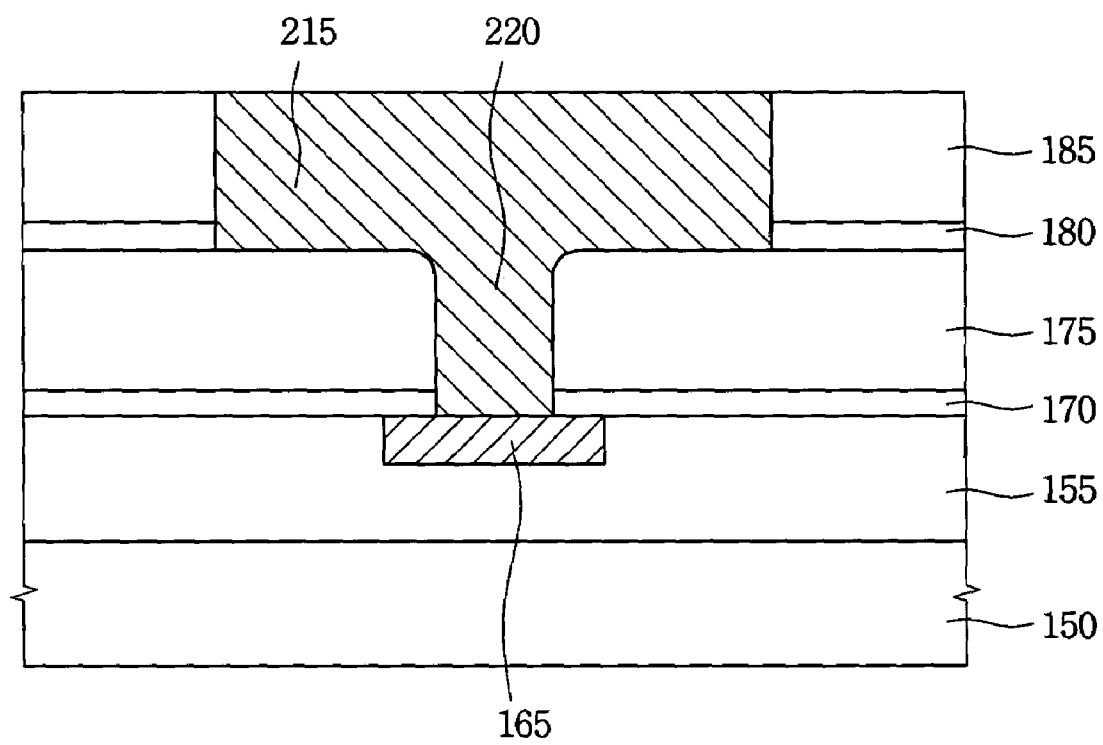

Referring to FIG. 5E, the second photoresist pattern 200 is removed, and a second etching process is performed using an etching solution having a composition based on the compositions of the capping layer 190, the third insulation film 185 and the second etch stop layer 180. As a result, the width of third trench 210 is increased. In this case, the capping layer 190, the third insulation film 185 and the second etch stop layer 180 are simultaneously etched. In addition, the second insulation film 175 can be simultaneously etched with the capping layer 190, the third insulation film 185 and the second etch stop layer 180. Alternatively, the second insulation film 175 can be etched after the capping layer 190, the third insulation film 185 and the second etch stop layer 180 are etched. In either case, the diameter of the via hole 210 can be increased.

A second conductive film (not shown) is formed on the capping layer 190 using a sputtering process, a CVD process or an electroplating process to fill the third trench 210 and the via hole 200. The second conductive film includes copper, aluminum, tungsten or titanium. Then, the second conductive film and the capping layer 190 are etched using an etch-back process or a CMP process until the third insulation film 185 is exposed. Hence, a second conductive pattern 215 and a third conductive pattern 220 are simultaneously formed in the third trench 210 and in the via hole 200, respectively. That is, a dual damascene structure is formed. The second conductive pattern 215 serves as a metal wiring such as a bit line of the semiconductor device, and the third conductive pattern 220 serves as a contact for connecting metal wirings.

According to the present invention, a trench is formed in a semiconductor substrate or an insulation film using a photoresist pattern having a stable structure as an etching mask. Then, a second etching process is performed using an etching solution tailored to the composition of the semiconductor substrate or the insulation film to widen the trench. Therefore, a metal wiring, an isolation film or a contact having precise and desired dimensions can be formed in the trench. Thus, the present invention is not subject to the problems of the prior art of producing semiconductor devices that fail due to the collapse of the photoresist pattern during the manufacturing process. In other words, the present invention produces reliable semiconductor devices at a sustainable high yield.

Finally, although the present invention has been described above in connection with the preferred embodiments thereof, various modifications thereto will become obvious to those of ordinary skill in the art. It is therefore to be understood that the preferred embodiments of the present invention may be modified or changed disclosed without departing from the true scope and spirit of the invention as set out in the appended claims.

What is claimed is:

1. A method of forming a trench for use in manufacturing a semiconductor device, said method comprising:
   forming one of an oxide film, a fluoride film and a nitride film as an insulation film on a substrate;
   forming a photoresist pattern on the insulation film;
   performing a first etching process comprising etching the insulation film through only part of its thickness using the photoresist pattern as a mask to form an initial trench in the insulation film; and
   subsequently performing a second etching process that is distinct from said first etching process, the second etching process comprising wet etching the insulation film, in which the initial trench has already been formed, to thereby enlarge the initial trench by spraying an etching solution onto the insulation layer while the substrate is being rotated.

2. A method of forming a conductive pattern for use in manufacturing a semiconductor device, said method comprising:
   forming an insulation film on a substrate;
   forming a photoresist pattern on the insulation film;
   performing a first etching process comprising etching the insulation film through only part of its thickness using the photoresist pattern as a mask to form an initial trench in the insulation film;
   subsequently performing a second etching process that is distinct from said first etching process, said second etching process being a wet etching process and comprising etching the insulation film, in which the initial trench is already formed, using etching solution including hydrogen fluoride, phosphoric acid and deionized water to thereby enlarge the initial trench; and
   depositing a conductive material in the enlarged trench to form a conductive pattern in the insulation film.

3. A method of forming a conductive pattern for use in manufacturing a semiconductor device, said method comprising:
   forming an insulation film on a substrate;
   forming a photoresist pattern on the insulation film;
   performing a first etching process comprising etching the insulation film through only part of its thickness using the photoresist pattern as a mask to form an initial trench in the insulation film;
   subsequently performing a second etching process that is distinct from said first etching process, the second etching process being a wet etching process and comprising etching the insulation film, in which the initial trench is already formed, using an etching solution including benzo triazole to thereby enlarge the initial trench; and
   depositing a conductive material, comprising copper, aluminum or tungsten, in the enlarged trench to form a conductive pattern in the insulation film, wherein the etching solution including the benzo triazole prevents the conductive material from oxidizing.

4. The method of claim 1, further comprising removing the photoresist pattern after the initial trench is formed and prior to the second etching process.

5. The method of claim 1, wherein said enlarging the initial trench comprises increasing a width of the initial trench while maintaining a depth of the initial trench.

6. A method of forming a trench for use in manufacturing a semiconductor device, said method comprising:
   forming an insulation film on a substrate;
   forming a photoresist pattern on the insulation film;
   performing a first etching process comprising etching the insulation film through only part of its thickness using the photoresist pattern as a mask to form an initial trench in the insulation film;
   subsequently removing the photoresist pattern; and
   subsequently performing a second etching process that widens the initial trench while maintaining the depth of the trench substantially the same as that of the initial trench, said second etching process being distinct from said first etching process and comprising wet etching the insulation film.

7. The method of claim 6, wherein said forming of the insulation film comprises forming one of an oxide film, a fluoride film and a nitride film on the substrate.

8. The method of claim 7, wherein the second etching process comprises immersing the substrate into a bath containing an etching solution.

9. The method of claim 7, wherein the second etching process comprises spraying an etching solution onto the insulation layer while the substrate is being rotated.

10. The method of claim 7, wherein said forming of the insulation film comprises forming one of an oxide film and a fluoride film on the substrate.

11. The method of claim 10, wherein the second etching process comprises wetting the film with an etching solution that includes hydrogen fluoride (HF), ammonium fluoride ($NH_4F$), hydrogen peroxide ($H_2O_2$) and deionized water ($H_2O$).

12. The method of claim 11, wherein the etching solution includes hydrogen fluoride, ammonium fluoride and deionized water in a volume ratio of about 1:1–10:1–10:100–500.

13. The method of claim 10, wherein said second etching process comprises etching the insulation film at a rate of about 40 to about 60 Å/minute.

14. The method of claim 10, wherein the etching solution further comprises an antioxidant.

15. The method of claim 14, wherein the antioxidant comprises benzo triazole (BTA).

16. The method of claim 7, wherein said forming of the insulation film comprises forming a nitride film on the substrate.

17. The method of claim 16, wherein the second etching process comprises wetting the nitride film with an etching solution that includes hydrogen fluoride, phosphoric acid ($H_3PO_4$) and deionized water.

18. The method of claim 16, wherein the etching solution further comprises an antioxidant.

19. The method of claim 18, wherein the antioxidant includes benzo triazole.

20. The method of claim 6, wherein the second etch process is performed without the use of an etch mask.

* * * * *